(12) United States Patent
Saito

(10) Patent No.: US 6,496,438 B2
(45) Date of Patent: Dec. 17, 2002

(54) SEMICONDUCTOR DEVICE AND METHOD FOR GENERATING INTERNAL POWER SUPPLY VOLTAGE

(75) Inventor: Syuichi Saito, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/783,617

(22) Filed: Feb. 15, 2001

(65) Prior Publication Data

US 2001/0017553 A1 Aug. 30, 2001

(30) Foreign Application Priority Data

Feb. 24, 2000 (JP) ........................................ 2000-047679

(51) Int. Cl.$^7$ .............................................. G11C 7/00
(52) U.S. Cl. ........................................ 365/226; 365/200
(58) Field of Search ............................ 365/226, 230.03, 365/269, 200; 363/21; 326/33

(56) References Cited

U.S. PATENT DOCUMENTS

| | | | | |
|---|---|---|---|---|
| 5,463,588 A | * | 10/1995 | Chonan | 365/266 |
| 5,973,484 A | * | 10/1999 | Cho | 323/269 |
| 6,021,080 A1 | * | 2/2001 | Miyano | 365/266 |
| 6,021,082 A1 | * | 2/2001 | Shirai | 365/266 |
| 6,195,306 B1 | * | 2/2001 | Horiguchi et al. | 365/266 |
| 6,229,753 B1 | * | 5/2001 | Kono et al. | 365/230.03 |

OTHER PUBLICATIONS

US patent application publication US 2001/0052792 A1 by Ooishi et al.*

* cited by examiner

*Primary Examiner*—David Nelms
*Assistant Examiner*—Thinh T. Nguyen
(74) *Attorney, Agent, or Firm*—Arent Fox Kintner Plotkin & Kahn

(57) ABSTRACT

A semiconductor device that optimally controls a current supply of internal power supply voltage generation circuits in accordance with the number of banks that are simultaneously activated. A control circuit adjusts the activated number of internal power supply voltage generation circuits in response to activation signals of the banks.

15 Claims, 7 Drawing Sheets

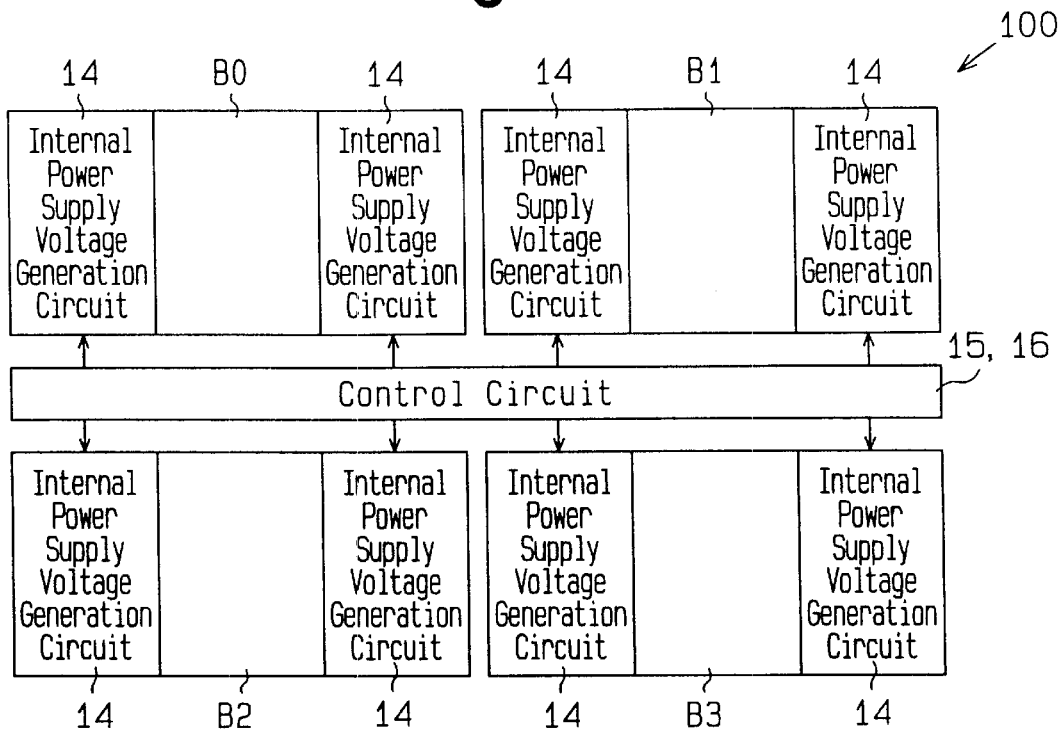
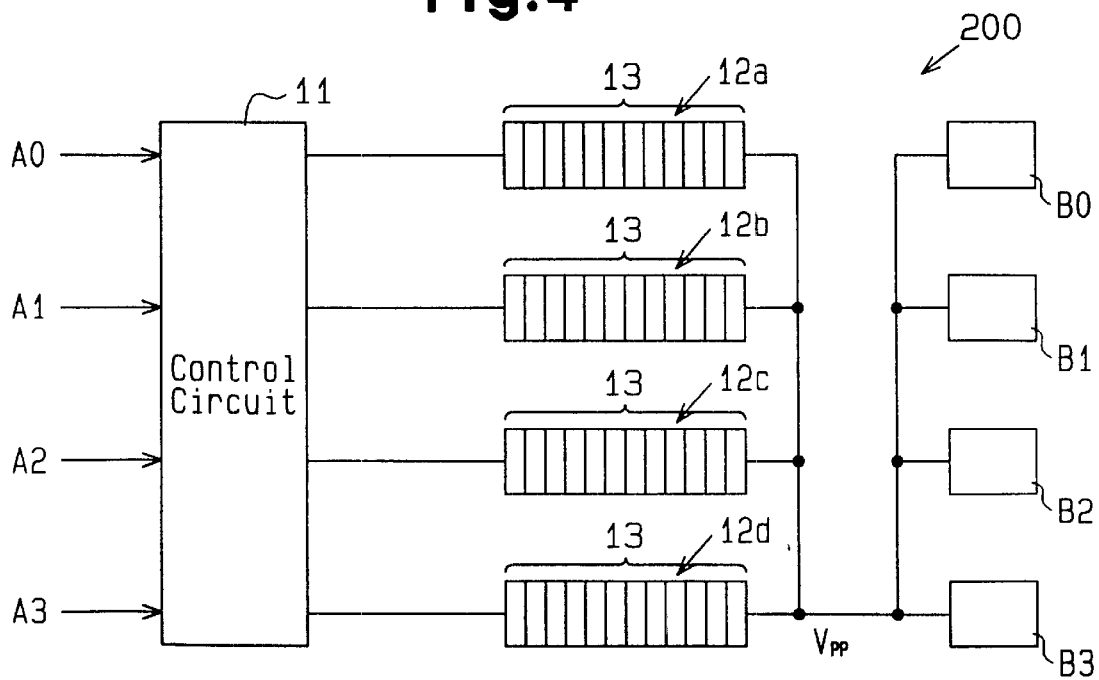

SEMICONDUCTOR DEVICE AND METHOD FOR GENERATING INTERNAL POWER SUPPLY VOLTAGE

BACKGROUND OF THE INVENTION

The present invention relates to semiconductor devices, and more particularly, to an internal power supply voltage generation circuit.

A semiconductor memory device, such as a clock synchronous DRAM (SDRAM), has a circuit for generating internal power supply voltage, such as step-up voltage supplied to word lines or negative voltage supplied to a substrate. To answer the recent demand for lower power consumptions of semiconductor memory devices, the voltages of an external power supply and an internal power supply must be decreased. Thus, there is a need for an internal voltage generation circuit that stably supplies a predetermined internal voltage from an external power supply, which voltage is relatively low.

FIG. 1 is a schematic block diagram of an SDRAM 50 having four banks. The SDRAM 50 includes step-up voltage generation circuits 2a–2h and control circuits 1a–1d, which control the step-up voltage generation circuits 2a–2h. The control circuits 1a–1d are each associated with one of the banks. Two of the step-up voltage generation circuits 2a–2h are connected to each control circuit 1a–1d. When the banks are activated, the associated control circuits 1a–1d are respectively provided with activation signals A0–A3. In response to the activation signals A0–A3, the control circuits 1a–1d generate the associated step-up voltage generation circuits 2a–2h. The activated step-up voltage generation circuits 2a–2h perform a pumping operation based on a clock signal to generate a step-up power supply voltage Vpp. The step-up power supply voltage Vpp is supplied to, for example, the word lines of the associated bank through a common output terminal.

A RAS cycle time (tRC) of the SDRAM 50 is defined by a period that starts when a certain word line is activated and ends when that word line is deactivated and returned to a standby state in which activation of the next word line is enabled. When a word line is activated, read, write, or refresh operations are performed.

The amount of charge consumed during a single RAS cycle time period is substantially constant in the conventional SDRAM 50. Thus, a shorter RAS cycle time tRC causes the power supply voltage Vpp to consume more current. In other words, the current consumption relative to the power supply voltage Vpp is maximal when the SDRAM is operated in the minimum RAS cycle time tRC of a predetermined guaranteed operation range.

Accordingly, the step-up voltage generation circuits 2a–2h each have a sufficient current supply capacity for supplying the associated bank with the maximum current consumption. For example, the step-up voltage generation circuits 2a, 2b are operated in response to the activation of the first bank to provide the first bank with the power supply voltage Vpp. When the first, second, third, and fourth banks are simultaneously activated, the step-up voltage generation circuits 2a–2h are simultaneously activated to provide each of the first to fourth banks with the power supply voltage Vpp. Such operation activates the step-up voltage generation circuits, the number of which corresponds to the number of activated banks, and stably supplies current in correspondence with the current consumption of the activated banks. The power supply voltage Vpp generated by each of the step-up voltage generation circuits 2a–2h may be supplied through a power supply line formed independently for each bank.

However, in the conventional SDRAM 50, the current supplied by the step-up voltage generation circuits becomes excessive as the number of simultaneously activated banks increases.

In FIG. 2, ACT denotes an activation command of an arbitrary bank, and PRE denotes a deactivation command of that bank. The time between one ACT and the next ACT is the RAS cycle time. For example, in FIG. 2, which indicates the operation of an SDRAM operated at a frequency of 100 MHz, the minimum RAS cycle time tRC of the banks is 60 ns. Accordingly, each of the step-up voltage generation circuits has the current supply capacity to supply sufficient current consumption when the associated bank is operated at the RAS cycle time tRC of 60 ns.

In the first line of FIG. 2, a single bank B0 is activated. In the second line, two banks, B0, B1 are continuously activated. In the first and second lines, each bank is operated in the minimum cycle tRC.

In the third line, three banks B0, B1, B2 are continuously activated. In this case, the operational frequency of each bank decreases due to device operation rules and extends the RAS cycle time tRC to 70 ns.

In this manner, as the number of simultaneously activated banks increases, the current supplied by the step-up voltage generation circuits 2a–2h becomes excessive, and the pumping operation of the step-up voltage generation circuits 2a–2h cause the voltage of the power supply voltage Vpp to become unstable.

A stabilization circuit may be incorporated in the SDRAM to detect and stabilize the power supply voltage Vpp. However, this would increase the circuit area of the SDRAM and the production cost of the SDRAM.

SUMMARY OF THE INVENTION

It is an object of the present invention to provide an internal power supply voltage generation circuit for generating an optimal amount of current supply in accordance with the power consumption of banks.

To achieve the above object, the present invention provides a semiconductor device including a plurality of banks, a plurality of internal power supply voltage generation circuits for generating an internal power supply voltage that is provided to the banks, and at least one control circuit connected to the internal power supply voltage generation circuits for controlling the internal power supply voltage generation circuits. The control circuit adjusts a current supply amount of the internal power supply voltage generation circuits in accordance with a current consumption of at least one of activated ones of the banks.

The present invention also provides a method for generating an internal power supply voltage of a semiconductor device having a plurality of banks and a plurality of internal power supply voltage generation circuits. The plurality of banks include a first bank and a second bank located in the vicinity of the first bank. The plurality of internal power supply voltage generation circuits include at least one internal power supply voltage generation circuit associated with the first bank and at least one second internal power supply voltage generation circuit associated with the second bank. The method includes determining the number of internal power supply voltage generation circuits that are to be activated in accordance with a current consumption of at least one of activated ones of the banks, and providing the at least one of activated ones of the banks with an internal power supply voltage by activating the determined number of internal power supply voltage generation circuits. When the first bank is activated, at least one of the first internal power supply voltage generation circuits and at least one of the second internal power supply voltage generation circuits are activated.

The present invention further provides a method for generating an internal power supply voltage of a semiconductor device having a plurality of banks that include a first bank and a second bank located in the vicinity of the first bank. The method includes assigning a plurality of internal power supply voltage generation circuits to each of the banks. The internal power supply voltage generation circuits generate internal power supply voltage provided to the banks. A current supply capacity of each of the internal power supply voltage generation circuits is equal to or less than a current consumption of when one of the banks is activated. The method further includes activating at least one of the internal power supply voltage generation circuits assigned to the first and second banks when the first bank is activated.

The present invention further provides a method for generating an internal power supply voltage having a plurality of banks and a plurality of internal power supply voltage generation circuits for generating an internal power supply that is provided to the banks. The method includes detecting a number M of the activated ones of the banks, and determining a number X of the internal power supply voltage generation circuits that are to activated in accordance with the number M. The number X of the internal power supply voltage circuits that are to be activated is expressed by X<N×M, where N represents the number of internal power supply voltage generation circuits that are activated when only one of the banks is activated.

The present invention further provides a semiconductor device including a plurality of banks, a plurality of internal power supply voltage generation circuits connected to the banks for generating an internal power supply voltage when activated that is provided to the banks, and a control circuit connected to the internal power supply voltage generation circuits for controlling the internal power supply voltage generation circuits. The control circuit selectively activates the internal power supply voltage generation circuits in accordance with the number of activated ones of the banks.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a schematic block diagram of an internal voltage generation circuit according to a first embodiment of the present invention;

FIG. 4 is a block diagram of an internal voltage generation circuit according to second embodiment of the present invention;

DETAILED DESCRIPTION OF THE PREFERRED EMBODIMENTS

Figure 1:
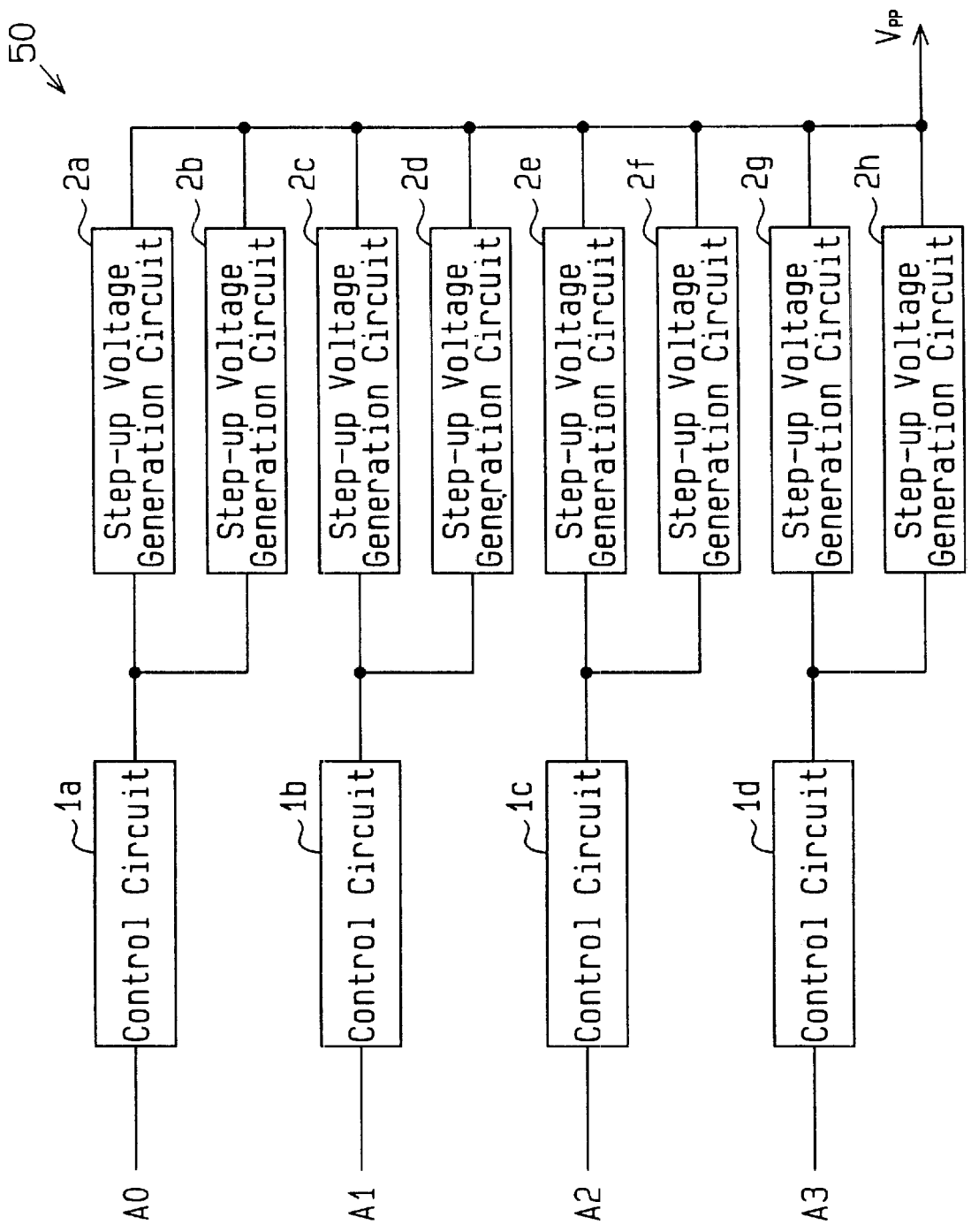
FIG. 1 is a schematic block diagram of a prior art internal voltage generation circuit.
Figure 2:
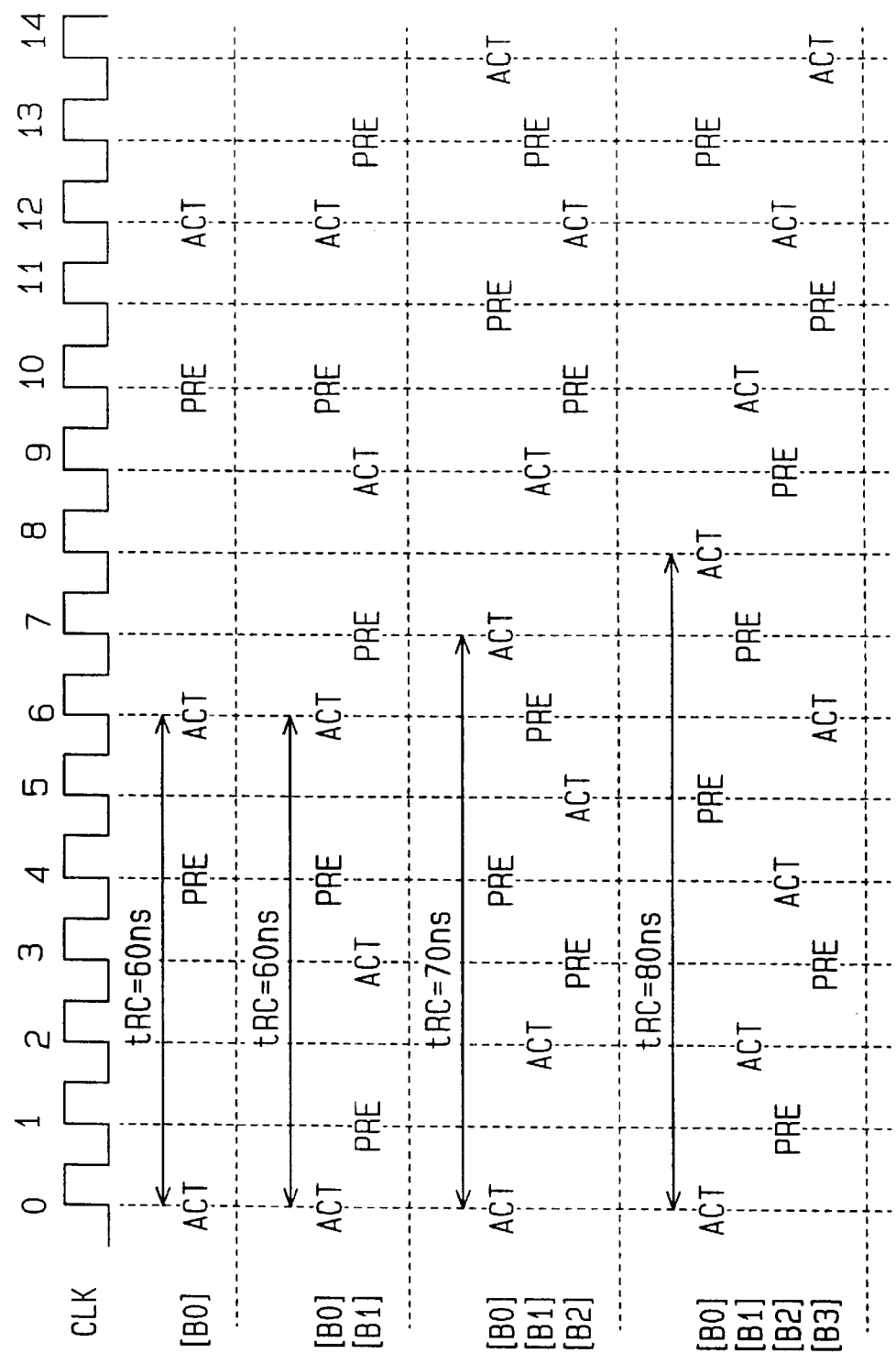
FIG. 2 is a time chart showing the relationship between the number of activated banks and the RAS cycle time.

FIG. 3 is a schematic block diagram of a semiconductor device 100 according to a first embodiment of the present invention. The semiconductor device 100 includes a plurality of banks B0, B1, B2, B3, internal power supply voltage generation circuits 14, which supply the banks B0–B3 with power supply voltage, and a control circuit 15, which controls the internal power supply voltage generation circuits 14. The control circuit 15 adjusts the total power supply capacity, or current supply amount, of the internal power supply voltage generation circuits 14. More specifically, the control circuit 15 adjusts the number of activated internal power supply voltage generation circuits 14 in accordance with the number of activated banks B0–B3. For example, if only one bank is activated, the control circuit 15 activates three internal power supply voltage generation circuits 14. The current generated by the three internal power supply voltage generation circuits 14 is supplied to the activated bank. If two banks are activated, the control circuit 15 generates six internal power supply voltage generation circuits 14. The current generated by the six internal power supply voltage generation circuits 14 is supplied to the two activated banks. If three banks are activated, the control circuit 15 generates seven internal power supply voltage generation circuits 14. The current generated by the seven internal power supply voltage generation circuits 14 is supplied to the three activated banks. If four banks are activated, the control circuit 15 generates eight internal power supply voltage generation circuits 14. The current generated by the eight internal power supply voltage generation circuits 14 is supplied to the four activated banks.

Accordingly, in accordance with the current consumption of the activated banks, the internal power supply voltage generation circuits 14 supply the activated banks with an optimal amount of current. This stabilizes the power supply voltage supplied to the banks. Further, a circuit for stabilizing the power supply voltage is not required. Thus, the semiconductor device 100 is relatively small.

FIG. 4 is a schematic block diagram of an SDRAM 200 according to a second embodiment of the present invention. The SDRAM 200 includes four banks B0, B1, B1, B2, four step-up voltage generation circuit groups 12a, 12b, 12c, 12d, which generate the step-up power supply voltage Vpp, and a control circuit 11, which is connected to the four step-up voltage generation circuit groups 12a–12d. A reference clock signal of the banks B0–B3 has a frequency that is preferably 100 MHz. When the banks are activated, associated activation signals A0–A3 are provided to the control circuit 11.

The step-up voltage generation circuit groups 12a–12d each include a plurality of (preferably, twelve) step-up voltage generation circuits 13. The first to fourth step-up voltage generation groups 12a–12d are each independently controlled by the control circuit 11. Presuming that the current consumption is represented by the value of 1 when each bank is operated in the minimum RAS cycle time tRC, the current supply capacity, or current supply amount, of each step-up voltage generation circuit 13 is 0.1. Accordingly, the total current supply capacity of each of the step-up voltage generation groups 12a–12d is 1.2. The first to fourth step-up voltage generation circuits 12a–12d generate the power supply voltage Vpp and provides the power supply voltage Vpp to each bank B0–B3 via a common power supply line.

Figure 5:
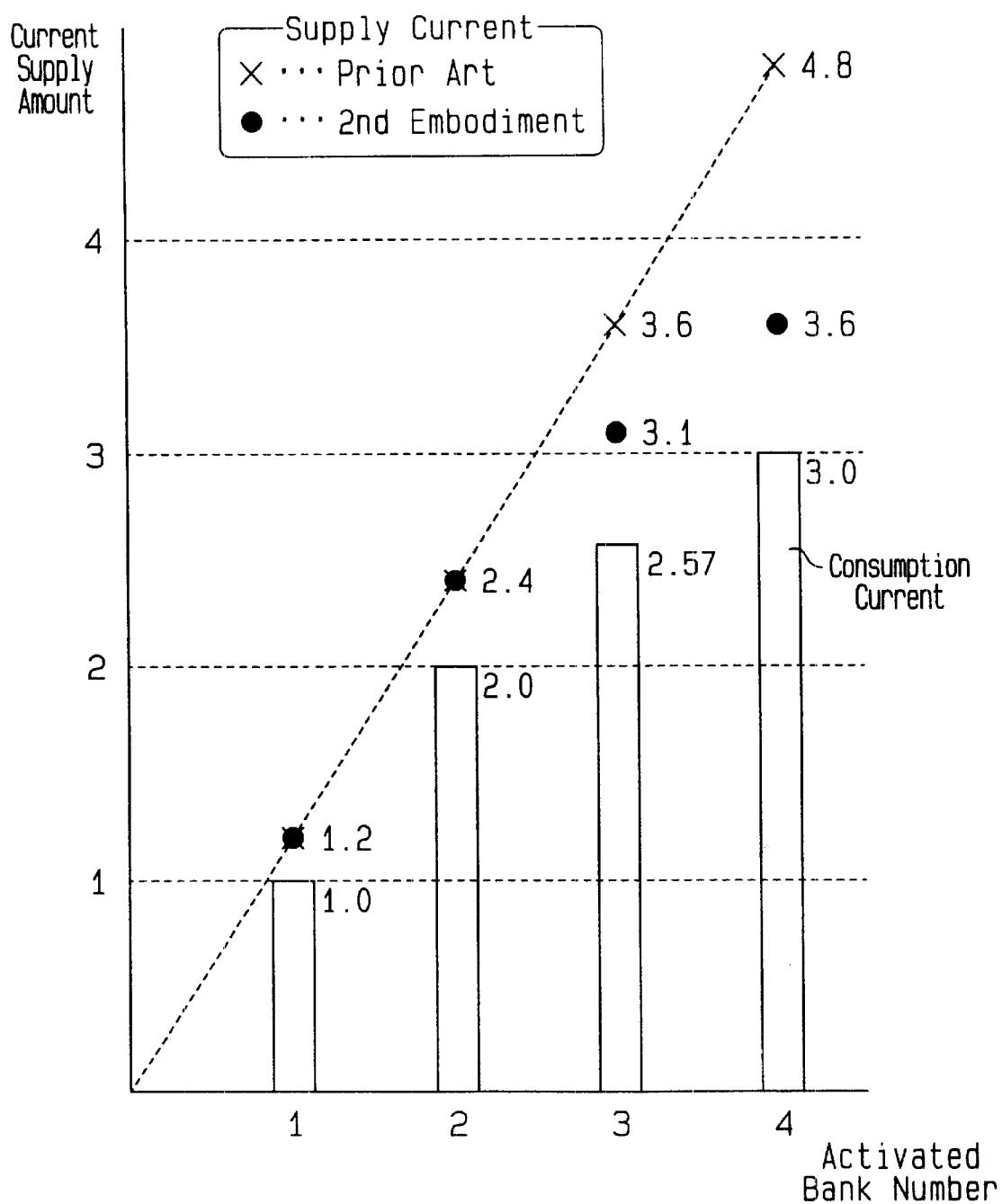
FIG. 5 is a graph showing the relationship between the number of activated banks, current consumption, and current supply in the internal voltage generation circuit of FIG. 4.

The operation of the control circuit 11 will now be described with reference to FIG. 5. FIG. 5 is a bar graph that indicates the current consumption of the banks B0–B3. The black circles represent the current supply in the second embodiment and the crosses represent the current supply in a conventional SDRAM.

As shown in FIG. 5, when one bank is activated, the current consumption is 1.0. For example, in response to the first activation signal A0, which is associated with the first bank B0, the control circuit 11 activates all 12 step-up voltage generation circuits 13 in the first step-up voltage generation circuit group 12a. In this case, the first step-up voltage generation circuit group 12a provides the first bank B0 with the power supply voltage Vpp at a current supply amount of 1.2, which has a margin of 20% relative to the current consumption (1.0) of the first bank B0.

When the first and second activation banks B0, B1 are activated, the associated activation signals A0, A1 are provided to the control circuit 11. In this case, the current consumption of the first and second banks B0, B1 is 2.0. Thus, the control circuit 11 activates all of the step-up voltage generation circuits 13 of the first and second step-up voltage generation circuit groups 12a, 12b. This causes the first and second step-up voltage generation circuit groups 12a, 12b to provide the first and second banks B0, B1 with the power supply voltage Vpp having a current supply amount of 2.4, which has a margin of 20% relative to the current consumption (2.0) of the first and second banks B0, B1.

When three banks are activated, for example, when the first to third banks B0, B1, B2 are activated, the RAS cycle time tRC of each of the banks B0–B2 is 70 ns. The maximum current consumption of the power supply voltage Vpp in this state is represented by equation I.

$$3.0 \times (6/7) = 2.57 \tag{I}$$

A value obtained by adding a margin of 20% to this value is represented by equation (II).

$$2.57 \times 1.2 = 3.084 \tag{II}$$

In this case, the control circuit 11 provides each of the banks B0–B2 with a power supply voltage Vpp having a current supply amount of 3.1, which has a margin of 20% relative to the maximum current consumption. For example, in response to the activation signals A0–A2, the control circuit 11 activates 31 step-up voltage generation circuits 13 of the first to third step-up voltage generation circuits 12a–12c.

In this case, the control circuit 11 activates substantially the same number of step-up voltage generation circuits 13 in each of the first to third step-up voltage generation circuit groups 12a–12c. For example, 11 step-up voltage generation circuits 13 are activated in the first step-up voltage generation circuit group 12a and 10 step-up voltage generation circuits 13 are activated in each of the second and third step up voltage generation circuit groups 12b, 12c.

When the four banks B0–B3 are activated and the control circuit 11 is provided with the activation signals A0–A3, the control circuit 11 generates 36 of the step-up voltage generation circuits 13 in the first to fourth voltage generation circuit groups 12a–12d.

The RAS cycle time tRC of each bank is 80 ns when all four banks are simultaneously activated. The maximum current consumption of the power supply voltage Vpp in such state is represented by equation III.

$$4.0 \times (6/8) = 3.0 \tag{III}$$

A value obtained by adding a margin of 20% to this value is represented by equation (IV).

$$3.0 \times 1.2 = 3.6 \tag{IV}$$

Thus, the control circuit 11 provides each of the banks B0–B3 with a power supply voltage Vpp having a current supply amount of 3.6, which has a margin of 20% relative to the maximum current consumption. In other words, the control circuit 11 activates 36 step-up voltage generation circuits 13.

The 36 step-up voltage generation circuits 13 are, for example, substantially equally selected from each of the step-up voltage generation groups 12a–12d. More specifically, the control circuit 11 activates nine of the step-up voltage generation circuits 13 in each of the step-up voltage generation circuit groups 12a–12d.

The SDRAM 200 of the second embodiment has the advantages described below.

(1) The control circuit 11 adjusts the current supply output from the step-up voltage generation circuit groups 12a–12d in accordance with the actual current consumption of the activated banks B0–B3. Thus, the voltage of the power supply voltage Vpp is adjusted in an optimal manner. Further, the voltage fluctuation of the power supply voltage Vpp is minimized even if all of the banks B0–B3 are activated.

(2) A larger number of step-up voltage generation circuits 13, which form each of the step-up voltage generation circuit groups 12a–12d, enables each step-up voltage generation circuit 13 to have a small current supply capacity. In this case, the control circuit 11 adjusts the current supply amount of the step-up voltage generation circuit groups 12a–12d in a finer manner in correspondence with the actual current consumption of the banks B0–B3.

The control circuit 11 may perform feedback control.

For example, when the control circuit 11 controls the step-up voltage generation circuits 13 in accordance with the number of the activated banks B0–B3, the generated step-up voltage may be detected and fed back to the control circuit 11. The control circuit 11 controls the step-up voltage generation circuit groups 12a–12d in accordance with the detected voltage. In other words, when the supply voltage Vpp reaches a predetermined value, the control circuit 11 doesn't activate the step-up voltage generation circuit groups 12a–12d. When the supply voltage Vpp decreases to a predetermined voltage, the control circuit 11 activates the step-up voltage generation circuit groups 12a–12d in accordance with the actual current consumption of the activated banks B0–B3.

Figure 6:
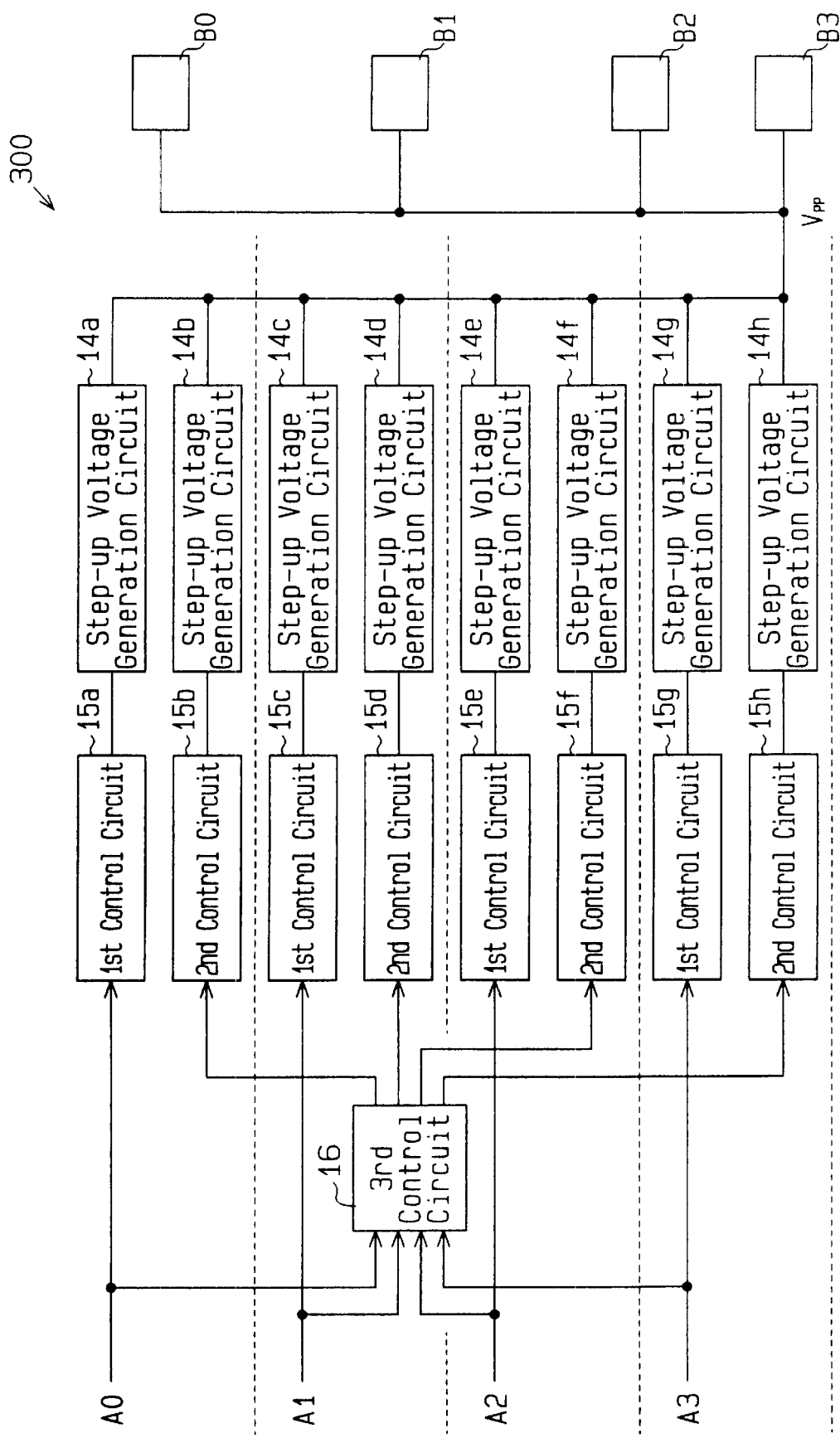
FIG. 6 is a schematic block diagram of an internal voltage generation circuit according to a third embodiment of the present invention.

FIG. 6 is a schematic block diagram of an SDRAM 300 according to a third embodiment of the present invention.

The SDRAM 300 has four banks B0–B3, eight step-up voltage generation circuits 14a–14h, four first control circuits 15a, 15c, 15e, 15g, which respectively control the step-up voltage generation circuits 14a, 14c, 14e, 14g, four second control circuits 15b, 15d, 15f, 15h, which respectively control the step-up voltage generation circuit 14b, 14d, 14f, 14h, and a third control circuit 16, which activates the second control circuits 15b, 15d, 15f, 15h. Two of the step-up voltage generation circuits, one of the first control circuits, and one of the second control circuits are assigned for each bank. For example, the step-up voltage generation circuits 14a, 14b, the first control circuit 15a, and the second control circuit 15b are assigned to the first bank B0. If the current consumption is represented by the value of 1 when each bank is operated at the minimum RAS cycle time tRC, the current supply capacity, or current supply amount, of each of the step-up voltage generation circuits 14a–14h is 0.45.

When the four banks B0–B3 are activated, the associated first control circuits 15a, 15c, 15e, 15g and the third control circuit 16 are respectively provided with activation signals A0–A3. For example, the first bank activation signal A0 is provided to the first control circuit 15a and the third control circuit 16. The second bank activation signal A1 is provided to the first control circuit 15c and the third control circuit 16. The third bank activation signal A2 is provided to the first control circuit 15e and the third control circuit 16. The fourth bank activation signal A3 is provided to the first control circuit 15g and the third control circuit 16.

Figure 7:
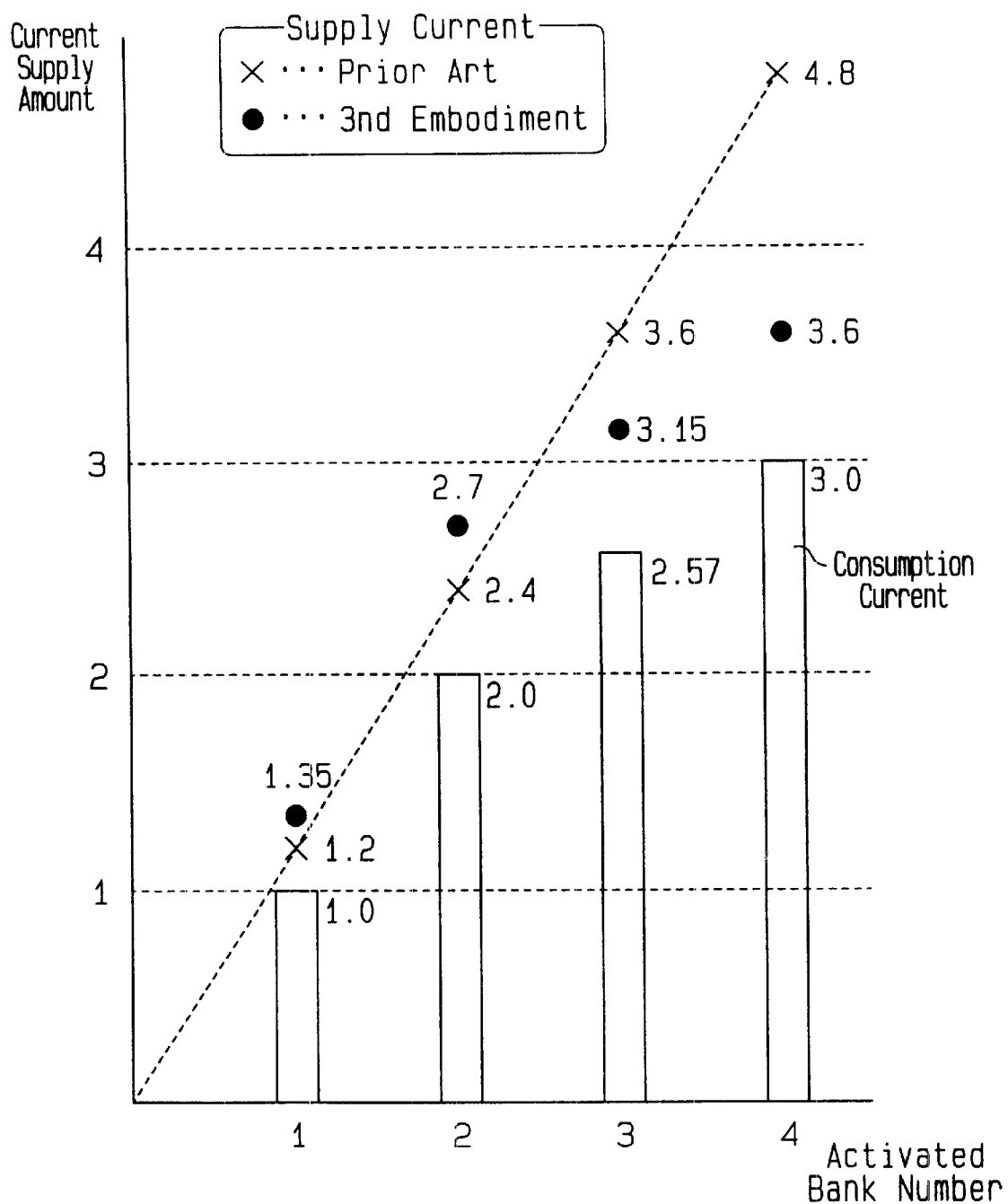
FIG. 7 is a graph showing the relationship between the number of activated banks, current consumption, and current supply in the internal voltage generation circuit of FIG. 6.

The operation of the first, second, and third control circuits 15a–15h, 16 will now be described with reference to FIG. 7, which shows the relationship between the number of activated banks, the current consumption, and the current supply. In the same manner as FIG. 5, the black circles represent the current supply in the third embodiment and the crosses represent the current supply in a conventional SDRAM.

For example, when only the first bank B0 is activated, the first control circuit 15a activates the step-up voltage generation circuit 14a in response to the activation signal A0. The third control circuit 16 also activates the step-up voltage generation circuits 14b, 14d via the second control circuits 15b, 15d in response to the activation signal A0. Accordingly, the activation signal A0 activates the three step-up voltage generation circuits 14a, 14b, 14d. In this case, the three step-up voltage generation circuits 14a, 14b, 14d provides the first bank B0 with the power supply voltage Vpp having a current supply amount of 1.35 as represented by equation V.

$$0.45 \times 3 = 1.35 \tag{V}$$

When only the second bank B1 is activated, the first control circuit 15c activates the step-up voltage generation circuit 14c in response to the activation signal A1. Further, the third control circuit 16 also activates the step-up voltage generation circuits 14d, 14f via the second control circuits 15d, 15f in response to the activation signal A1. In this case, the current supply amount of the three step-up voltage generation circuits 14c, 14d, 14f is 1.35.

In this manner, when one bank is activated, the two step-up voltage generation circuits assigned to the bank are activated. Further, the third control circuit 16 activates one of the step-up voltage generation circuits assigned to the adjacent bank. This provides the desired power supply voltage Vpp.

For example, when the first and second banks B0, B1 are activated, the first control circuit 15a activates the step-up voltage generation circuit 14a in response to the activation signal A0, and the first control circuit 15c activates the step-up voltage generation circuit 14c in response to the activation signal A1. Further, in response to the activation signals A0, A1, the third control circuit 16 activates the four step-up voltage generation circuits 14b, 14d, 14f, 14h via the second control circuits 15b, 15d, 15f, 15h.

In this case, the current consumption of the first and second banks B0, B1 is 2.0, and the current supply amount of the step-up voltage generations circuits 14a, 14b, 14c, 14d, 14f, 14h is 2.70 as represented by equation VI.

$$0.45 \times 6 = 2.70 \tag{VI}$$

In this manner, when the two banks B0, B1 are activated, the four step-up voltage generation circuits 14a, 14b, 14c, 14d assigned to the banks B0, B1 are activated. Further, the third control circuit 16 activates two step-up voltage generation circuits 14f, 14h, which are assigned to the banks B2, B3. This provides the desired power supply voltage Vpp to the two banks B0, B1.

For example, when the first, second, and third banks B0, B1, B2 are activated, the first control circuits 15a, 15c, 15e activate the step-up voltage generation circuits 14a, 14c, 14e in response to the activation signals A0, A1, A2. Further, in response to the activation signals A0, A1, A2, the third control circuit 16 activates the step-up voltage generation circuits 14b, 14d, 14f, 14h via the second control circuits 15b, 15d, 15f, 15h.

In this case, the total current consumption of the first, second, and third banks B0, B1, B2 is 2.57, and the current supply amount of the step-up voltage generations circuits 14a, 14b, 14c, 14d, 14e, 14f, 14h is 3.15 as represented by equation VII.

$$0.45 \times 7 = 3.15 \tag{VII}$$

In this manner, when the three banks B0, B1, B2 are activated, the six step-up voltage generation circuits 14a, 14b, 14c, 14d, 14e, 14f assigned to the banks B0, B1, B2 are activated. Further, the third control circuit 16 activates the step-up voltage generation circuit 14h, which is assigned to the bank B3 that is adjacent to the bank B2. This provides the desired power supply voltage Vpp to the three banks B0, B1, B2.

When the first, second, third, and fourth banks B0, B1, B2, B3 are activated, the first control circuits 15a, 15c, 15e, 15g and the third control circuit 16 activate all of the step-up voltage generation circuits 14a–14h in response to the activation signals A0, A1, A2, A3.

In this case, the total current consumption of the first, second, third, and fourth banks B0, B1, B2 is 3.0, and the current supply amount of the step-up voltage generations circuits 14a, 14b, 14c, 14d, 14e, 14f, 14g, 14h is 3.6 as represented by equation VIII.

$$0.45 \times 8 = 3.6 \tag{VIII}$$

The third embodiment has the advantages described below.

(1) Regardless of the number of activated banks, a power supply voltage Vpp constantly having a margin of substantially 20% is provided to the banks.

(2) When all of the banks are activated, the actual current consumption of the banks is 3.0 and the current supply amount of the step-up voltage generation circuits is 3.6. That is, in the third embodiment, the maximum current supply has a sufficient margin and is less than the maximum current supply amount (4.8) of the prior art. Accordingly, stable power supply voltage is provided to the banks at an optimal current supply amount.

Figure 8:
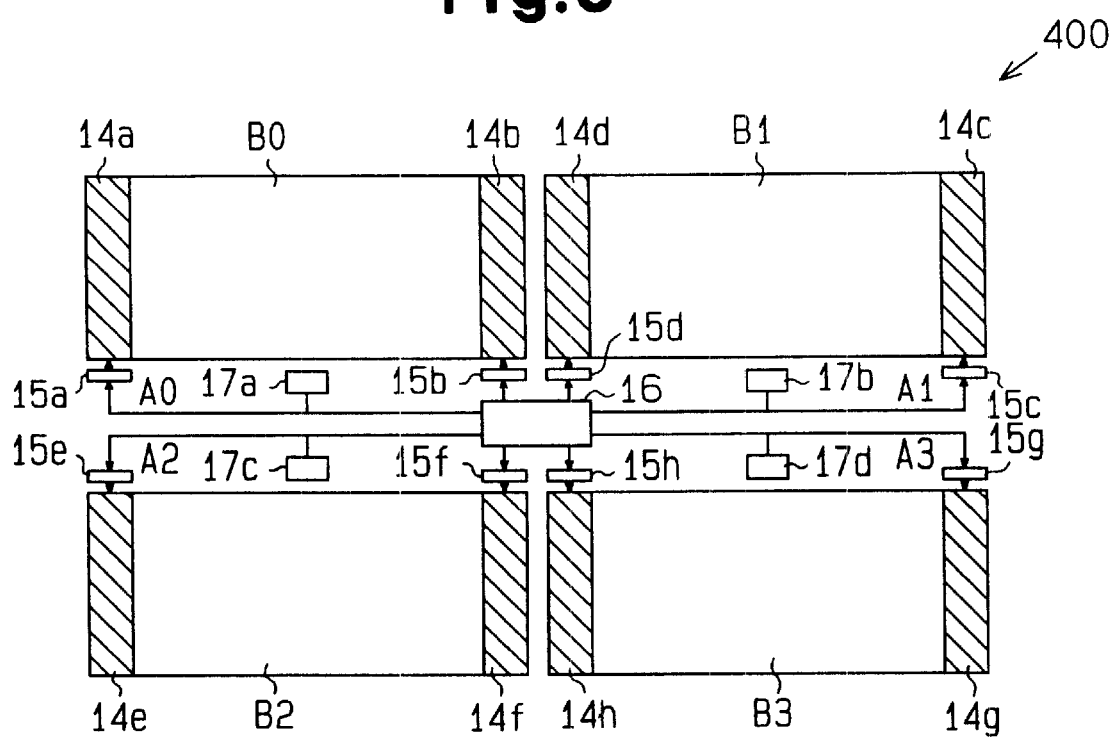
FIG. 8 is a diagram showing a layout of an internal voltage generation circuit according to a fourth embodiment of the present invention.

With reference to FIG. 8, an SDRAM 400 according to a fourth embodiment of the present invention includes first to fourth banks B0–B3, step-up voltage generation circuits 14a–14h located beside the banks B0–B3, a second control circuit 16 surrounded by the first to fourth banks B0–B3, first control circuits 15a–15h located between the step-up voltage generation circuits 14a–14h and the second control circuit 16, and command input sections 17a–17d respectively located near the banks B0–B3. The command input sections 17a–17d respectively provide the activation signals A0–A3 to the first control circuits 15a, 15c, 15e, 15g and the first control circuits 15b, 15d, 15f, 15h via the second control circuit 16.

The operation of the SDRAM 400 of the fourth embodiment is similar to that of the third embodiment. For example, when the bank B0 is activated, the three step-up voltage generation circuits 14a, 14b, 14d are activated. When the two banks B0, B1 are activated, the six step-up voltage generation circuits 14a, 14b, 14c, 14d, 14f, 14h are activated.

In this manner, the step-up voltage generation circuits located in the vicinity of the activated banks are activated and the power supply voltage Vpp is provided to the activated banks. Thus, the power supply voltage Vpp is stabilized.

Figure 9:
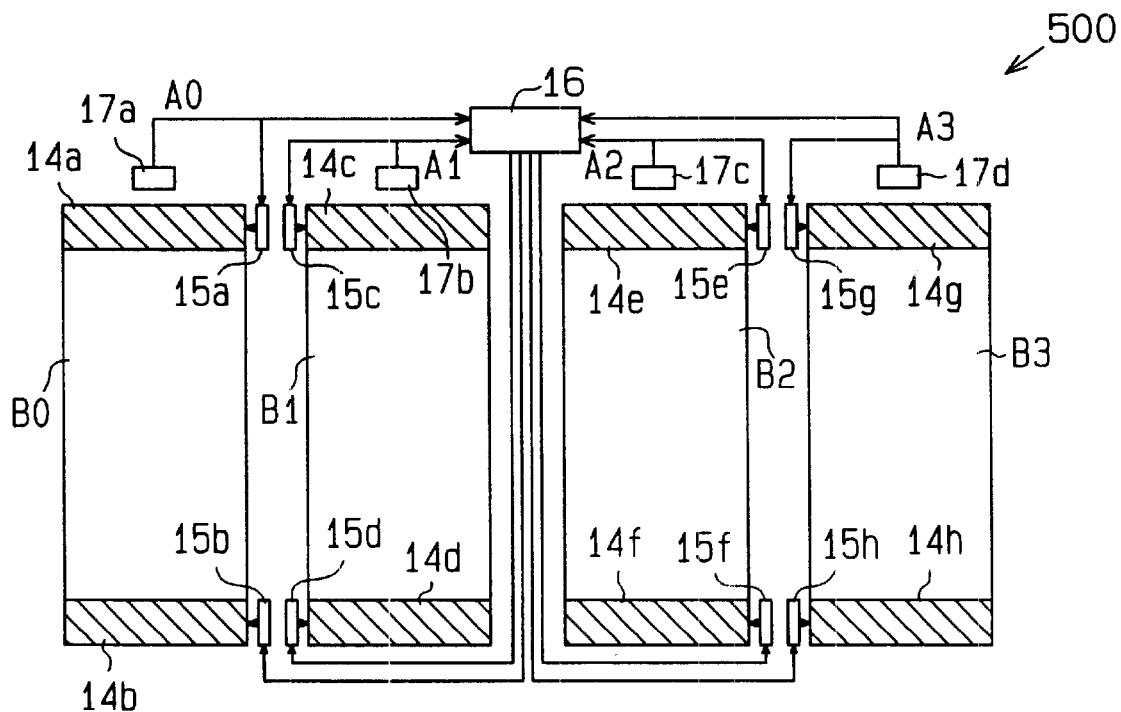
FIG. 9 is a diagram showing a layout of an internal voltage generation circuit according to a fifth embodiment of the present invention.

With reference to FIG. 9, an SDRAM 500 according to a fifth embodiment of the present invention has first to fourth banks B0–B3, which are connected in parallel. Step-up voltage generation circuits 14a–14h are located beside the banks B0–B3. First control circuits 15a, 15c are located between the adjacent step-up voltage generation circuits 14a, 14c. First control circuits 15b, 15d are located between the adjacent step-up voltage generation circuits 14b, 14d. First control circuits 15e, 15g are located between the adjacent step-up voltage generation circuits 14e, 14g. First control circuits 15f, 15h are located between the adjacent step-up voltage generation circuits 14f, 14h.

Command input sections 17a–17d are respectively located next to the banks B0–B3. The second control circuit 16 is located between the banks B1, B2.

The activation signals A0–A3 are provided to the command input sections 17a–17d, respectively. The command input sections 17a–17d then respectively provide the activation signals A0–A3 to the first control circuits 15a, 15c, 15e, 15g and the first control circuits 15b, 15d, 15f, 15h via the second control circuit 16.

The operation of the SDRAM 500 of the fifth embodiment is similar to that of the third embodiment. For example, when the bank B0 is activated, the three step-up voltage generation circuits 14a, 14b, 14d are activated. When the two banks B0, B1 are activated, the six step-up voltage generation circuits 14a, 14b, 14c, 14d, 14f, 14h are activated.

In this manner, the step-up voltage generation circuits located in the vicinity of the activated banks are activated and the power supply voltage Vpp is provided to the activated banks. Thus, the power supply voltage Vpp is stabilized.

It should be apparent to those skilled in the art that the present invention may be embodied in many other specific forms without departing from the spirit or scope of the invention. Particularly, it should be understood that the present invention may be embodied in the following forms.

In each of the above embodiments, instead of the step-up voltage generation circuits, the present invention may be applied to other internal voltage generation circuits, such as a negative pressure generation circuit or a step-down voltage generation circuit. Further, the number of banks is not limited and may be changed when necessary.

What is claimed is:

1. A semiconductor device comprising:
    a plurality of banks;
    a plurality of internal power supply voltage generation circuits for generating an internal power supply voltage that is provided to the banks; and
    at least one control circuit connected to the internal power supply voltage generation circuits for controlling the internal power supply voltage generation circuits, wherein the control circuit adjusts a current supply amount of the internal power supply voltage generation circuits in accordance with a current consumption of at least one of activated ones of the banks by changing the number of internal power supply voltage generation circuits that are to be activated.

2. The semiconductor device according to claim 1, wherein the control circuit adjusts the number of the internal power supply voltage generation circuits that are activated in accordance with the operational frequency.

3. The semiconductor device according to claim 2, wherein the operational frequency of the semiconductor device corresponds to a cycle time that starts when each of the banks are activated and ends when each of the banks are activated the next time.

4. The semiconductor device according to claim 1, wherein each of the banks are activated in response to an external signal, and wherein the control circuit selects one or more of the internal power supply voltage generation circuits that are to be activated in accordance with the position of the one or more banks that are activated.

5. The semiconductor device according to claim 1, wherein the plurality of banks includes a first bank and a second bank located in the vicinity of the first bank, wherein the plurality of internal power supply voltage generation circuits includes a plurality of first internal power supply voltage generation circuits assigned to the first bank and a plurality of second internal power supply voltage generation circuits assigned to the second bank, and wherein, when the first bank is activated, the control circuit activates at least one of the first and second internal power supply voltage generation circuits.

6. The semiconductor device according to claim 5, wherein, when the first bank is activated, the control circuit activates all of the first internal power supply voltage generation circuits and at least one of the second internal power supply voltage generation circuits.

7. A method for generating an internal power supply voltage of a semiconductor device having a plurality of banks and a plurality of internal power supply voltage generation circuits, wherein the plurality of banks include a first bank and a second bank located in the vicinity of the first bank, and the plurality of internal power supply voltage generation circuits include at least one internal power supply voltage generation circuit associated with the first bank and at least one second internal power supply voltage generation circuit associated with the second bank, the method comprising the steps of:
    determining the total number of internal power supply voltage generation circuits that are to be activated in accordance with a current consumption of at least one of activated ones of the banks; and
    providing the at least one activated ones of the banks with an internal power supply voltage by activating the determined number of internal power supply voltage generation circuits, wherein, when the first bank is activated, at least one of the first internal power supply voltage generation circuits and at least one of the second internal power supply voltage generation circuits are activated.

8. A method for generating an internal power supply voltage of a semiconductor device having a plurality of banks that include a first bank and a second bank located in the vicinity of the first bank, the method comprising the steps of:

assigning a plurality of internal power supply voltage generation circuits to each of the banks, wherein the internal power supply voltage generation circuits generate internal power supply voltage provided to the banks, and wherein a current supply capacity of each of the internal power supply voltage generation circuits is equal to or less than a current consumption of when one of the banks is activated; and activating at least one of the internal power supply voltage generation circuits assigned to the first and second banks when the first bank is activated.

9. A method for generating an internal power supply voltage having a plurality of banks and a plurality of internal power supply voltage generation circuits for generating an internal power supply that is provided to the banks, the method comprising the steps of:

detecting a number M of the activated ones of the banks;

determining a number X of the internal power supply voltage generation circuits that are to activated in accordance with the number M, the number X of the internal power supply voltage circuits that are to be activated being expressed by X<N×M, wherein N represents the number of internal power supply voltage generation circuits that are activated when only one of the banks is activated.

10. A semiconductor device comprising:

a plurality of banks;

a plurality of internal power supply voltage generation circuits connected to the banks for generating an internal power supply voltage when activated that is provided to the banks; and a control circuit connected to the internal power supply voltage generation circuits for controlling the internal power supply voltage generation circuits, wherein the control circuit selectively activates the internal power supply voltage generation circuits and changes the number of internal power supply voltage generation circuits that are to be activated in accordance with the number of activated ones of the banks.

11. The semiconductor device according to claim 10, wherein the plurality of banks includes a first bank and a second bank located in the vicinity of the first bank, wherein the plurality of internal power supply voltage generation circuits includes a plurality of first internal power supply voltage generation circuits assigned to the first bank and a plurality of second internal power supply voltage generation circuits assigned to the second bank, and wherein, when one of the banks are activated, the control circuit activates at least one of the first and second internal power supply voltage generation circuits.

12. The semiconductor device according to claim 10, wherein, when the first bank is activated, the control circuit activates all of the first internal power supply voltage generation circuits and at least one of the second internal power supply voltage generation circuits.

13. The semiconductor device according to claim 10, wherein each of the banks is connected to an internal power supply voltage generation circuit group formed by a plurality of the internal power supply voltage generation circuits.

14. The semiconductor device according to claim 13, wherein the control circuit activates substantially the same number of the internal power supply voltage generation circuits in each of the internal power supply voltage generation circuit groups in accordance with a current consumption of the activated ones of the banks.

15. A semiconductor device comprising:

a plurality of banks;

a plurality of internal power supply voltage generation circuits for generating an internal power supply voltage that is provided to the banks; and at least one control circuit connected to the internal power supply voltage generation circuits for controlling the internal power supply generation circuits, wherein the control circuit adjusts a current supply amount of the internal power supply voltage generation circuits, which has a constant margin relative to a current consumption of at least one of activated ones of the banks.

* * * * *